(12) United States Patent
Liao et al.

(10) Patent No.: US 7,075,231 B1
(45) Date of Patent: Jul. 11, 2006

(54) TANDEM OLEDS HAVING LOW DRIVE VOLTAGE

(75) Inventors: Liang-Sheng Liao, Rochester, NY (US); Tukaram K. Hatwar, Penfield, NY (US); Kevin P. Klubek, Webster, NY (US); J. Ramon Vargas, Webster, NY (US); Dustin L. Comfort, Webster, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/028,033

(22) Filed: Jan. 3, 2005

(51) Int. Cl.
*H01J 1/62* (2006.01)
*H01J 63/04* (2006.01)

(52) U.S. Cl. .................. 313/506; 313/503; 313/504

(58) Field of Classification Search ................ 313/506, 313/503, 504, 509
See application file for complete search history.

(56) References Cited

U.S. PATENT DOCUMENTS

| 4,769,292 A | 9/1988 | Tang et al. |
|---|---|---|
| 4,885,211 A | 12/1989 | Tang et al. |
| 6,107,734 A | 8/2000 | Tanaka et al. |
| 6,124,964 A * | 9/2000 | Imanishi et al. ............ 359/248 |
| 6,337,492 B1 | 1/2002 | Jones et al. |
| 6,717,358 B1 | 4/2004 | Liao et al. |
| 2002/0121860 A1* | 9/2002 | Seo et al. .................... 313/506 |
| 2003/0170491 A1 | 9/2003 | Liao |
| 2003/0189401 A1 | 10/2003 | Kido |
| 2005/0175856 A1* | 8/2005 | Rogers et al. .............. 428/690 |

OTHER PUBLICATIONS

English Abstract of JP 2003-045676.

* cited by examiner

*Primary Examiner*—Joseph Williams
*Assistant Examiner*—Bumsuk Won
(74) *Attorney, Agent, or Firm*—Raymond L. Owens

(57) ABSTRACT

A tandem OLED includes an anode, a cathode, and at least two electroluminescent units disposed between the anode and the cathode, wherein each of the electroluminescent units includes at least one hole-injecting layer, one hole-transporting layer, one organic light-emitting layer, one electron-transporting layer, and one electron-injecting layer. The OLED also includes at least one intermediate connector, wherein each of the intermediate connectors includes at least one layer, and wherein each of the intermediate connectors is disposed between electroluminescent units, wherein the thickness of each layer in each of the electroluminescent units and the intermediate connectors is selected to satisfy the test condition that the voltage drop from the anode to the cathode is less than 4.0 V×N (the number of electroluminescent units) at 20 mA/cm$^2$.

20 Claims, 6 Drawing Sheets

TANDEM OLEDS HAVING LOW DRIVE VOLTAGE

CROSS REFERENCE TO RELATED APPLICATIONS

Reference is made to commonly assigned U.S. patent application Ser. No. 10/437,195 filed May 13, 2003 by Liang-Sheng Liao, et al., entitled "Cascaded Organic Electroluminescent Device Having Connecting Units With n-Type and p-Type Organic Layers"; U.S. patent application Ser. No. 10/857,516 filed May 28, 2004 by Liang-Sheng Liao, et al., entitled "Tandem OLED Having Stable Intermediate Connectors"; U.S. patent application Ser. No. 10/922,606 filed Aug. 20, 2004 by Liang-Sheng Liao, et al., entitled "White OLED Having Multiple White Electroluminescence Units"; and U.S. patent application Ser. No. 10/970,928 filed Oct. 22, 2004 by Liang-Sheng Liao, et al., entitled "White OLEDs With a Color Compensated Electroluminescent Unit", the disclosures of which are herein incorporated by reference.

FIELD OF INVENTION

The present invention relates to providing a plurality of organic electroluminescent (EL) units to form a tandem organic electroluminescent device having low drive voltage.

BACKGROUND OF THE INVENTION

An organic light-emitting diode device, also called an OLED or an organic electroluminescent (EL) device, commonly includes an anode, a cathode, and an organic electroluminescent (EL) unit sandwiched between the anode and the cathode. The organic EL unit includes at least a hole-transporting layer (HTL), an organic light-emitting layer (LEL), and an electron-transporting layer (ETL). OLEDs are attractive because of their low drive voltage, high luminance, wide viewing angle and capability for full color displays and for other applications. Tang, et al. described this multilayer OLED in their U.S. Pat. Nos. 4,769,292 and 4,885,211. Since then, numerous OLEDs with alternative layer structures and using many different types of organic EL materials have been disclosed.

An OLED is actually a current driven device. Its luminance is proportional to current density, but its lifetime is inversely proportional to current density. In order to achieve high brightness, an OLED has to be operated at a relatively high current density, but this will result in a short lifetime. Thus, it is critical to improve the luminous efficiency of an OLED while operating at the lowest possible current density.

In order to dramatically improve luminous efficiency and to increase the lifetime for OLEDs, a tandem OLED (or stacked OLED, or cascaded OLED) structure, which is fabricated by stacking several individual OLEDs vertically and driven by only a single power source, has been proposed or fabricated. See U.S. Pat. Nos. 6,337,492, 6,107,734, 6,717,358, JP Patent Publication 2003-045676, U.S. Patent Publications 2003/0189401 A1, and 2003/0170491 A1. In a tandem OLED having a number of N EL units, the luminous efficiency can be N times as high as that of a conventional OLED containing only one EL unit. Therefore, the tandem OLED needs only about 1/N of the current density used in a conventional OLED to achieve the same luminance. As a result, the lifetime of the tandem OLED will be about N times that of a conventional OLED. However, the drive voltage will be about N times as high as that of a conventional OLED at the same current density.

In display applications, there is a voltage limit for the circuitry. For example, in an active matrix OLED display based on a thin film transistor (TFT) backplane or drive circuitry, the maximum permitted voltage drop across the OLED component can be less than 12 volts (V). A tandem OLED structure may not be suitable for use in display applications if its drive voltage is higher than 12 V to produce an intended luminance. Therefore, it is important to make a tandem OLED with a drive voltage suitable for display applications. However, the aforementioned prior art does not disclose a tandem OLED containing more than two EL units and with a drive voltage suitable for the common TFT drive circuitry.

SUMMARY OF THE INVENTION

In the present invention, tandem OLEDs are constructed using a plurality of EL units and intermediate connectors, and the devices are driven only using a single power source.

It is an object of the present invention to make tandem OLEDs useful in display applications.

It is another object of the present invention to make tandem OLEDs having a low drive voltage compatible with TFT drive circuitry.

These objects are achieved by a tandem OLED comprising:

a) an anode;

b) a cathode;

c) at least two electroluminescent units disposed between the anode and the cathode, wherein each of the electroluminescent units includes at least one hole-injecting layer, one hole-transporting layer, one organic light-emitting layer, one electron-transporting layer, and one electron-injecting layer;

d) at least one intermediate connector, wherein each of the intermediate connectors includes at least one layer, and wherein each of the intermediate connectors is disposed between electroluminescent units; and e) wherein the thickness of each layer in each of the electroluminescent units and the intermediate connectors is selected to satisfy the test condition that the voltage drop from the anode to the cathode is less than 4.0 V×N (the number of electroluminescent units) at 20 mA/cm$^2$.

The present invention makes use of a five-layer EL unit structure with thin LELs, instead of a conventional three-layer EL unit structure with thick LELs, in conjunction with thin intermediate connectors in a tandem OLED. By considering both the carrier transporting capability in most of the organic layers and the carrier injecting capability at each interface, both EL units and intermediate connectors in a tandem OLED can have low voltage drops. Due to low drive voltage and high luminous efficiency, this tandem OLED can be made useful for display applications.

It is a feature of the present invention to provide a tandem OLED with high luminance efficiency and high brightness.

It is another feature of the present invention to provide a tandem OLED with improved lifetime.

Figure 8:
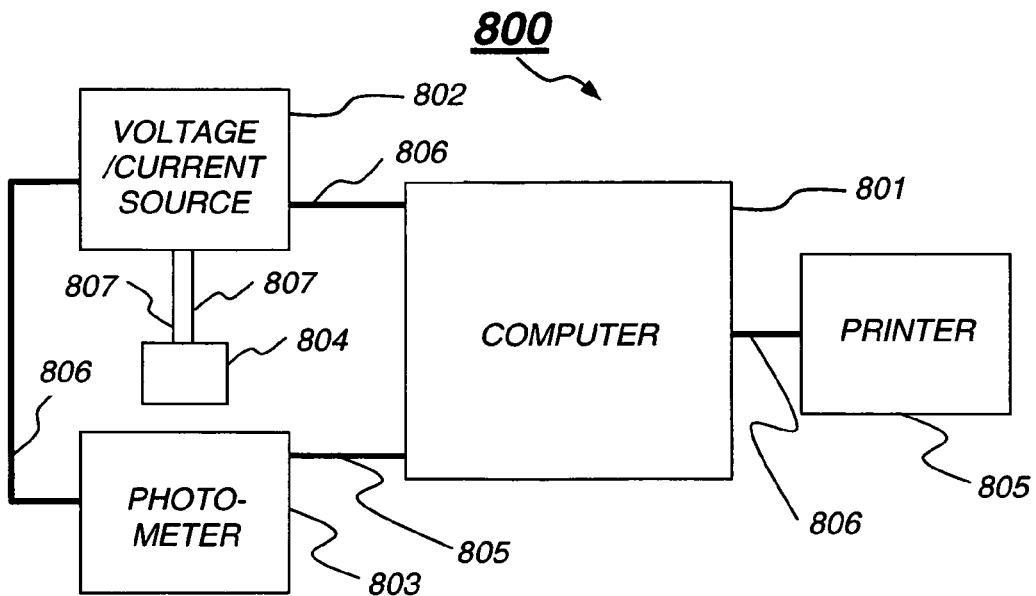
FIG. 8 is a schematic of a computerized test setup for measurement of the current density-voltage (J-V) characteristics and the luminance-voltage (L-V) characteristics of OLEDs.

It will be understood that FIGS. 1–6 are not to scale since the individual layers are too thin and the thickness differences of various layers too great to permit depiction to scale, and that FIG. 8 is also not to scale.

DETAILED DESCRIPTION OF THE INVENTION

Figure 1:
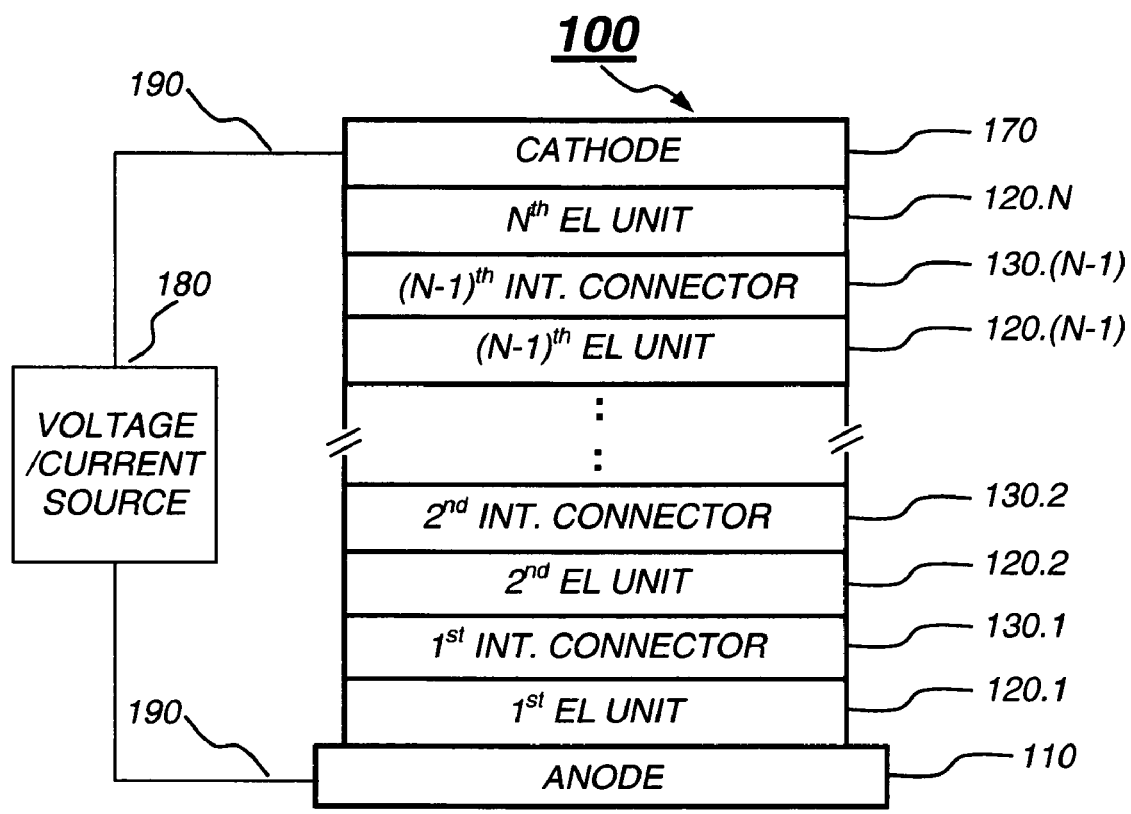
FIG. 1 depicts a schematic cross sectional view of a tandem OLED, having N(N≧1) EL units connected in series by N−1 intermediate connectors, in accordance with the present invention.

FIG. 1 shows a tandem OLED 100 in accordance with the present invention. This tandem OLED has an anode 110 and a cathode 170, at least one of which is transparent. Disposed between the anode and the cathode are N EL units and N−1 intermediate connectors (each of them indicated as "int. connector" in the figure), where N is an integer greater than 1. The EL units, stacked and connected serially, are designated 120.1 to 120.N where 120.1 is the first EL unit (adjacent to the anode), 120.2 is the second EL unit, 120.N−1 is the (N−1)$^{th}$ EL unit, and 120.N is the N$^{th}$ EL unit (nearby the cathode). The intermediate connectors, disposed between the EL unit, are designated 130.1 to 130.(N−1) where 130.1 is the first intermediate connector disposed between EL units 120.1 and 120.2; 130.2 is the second intermediate connector in contact with EL unit 120.2 and another EL unit (not shown in the figure); and 130.(N−1) is the last intermediate connector disposed between EL units 120.(N−1) and 120.N. The tandem OLED 100 is externally connected to a voltage/current source 180 through electrical conductors 190.

Tandem OLED 100 is operated by applying an electric potential produced by a voltage/current source 180 between a pair of contact electrodes, anode 110 and cathode 170. Under a forward bias, this externally applied electrical potential is distributed among the N EL units and the N−1 intermediate connectors in proportion to the electrical resistance of each of these units and connectors. The electric potential across the tandem OLED causes holes (positively charged carriers) to be injected from anode 110 into the 1$^{st}$ EL unit 120.1, and electrons (negatively charged carriers) to be injected from cathode 170 into the N$^{th}$ EL unit 120.N. Simultaneously, electrons and holes are produced in, and separated from, each of the intermediate connectors, (130.1–130.(N−1)). Electrons thus produced, for example, in intermediate connector 130.1 are injected towards the anode and into the adjacent EL unit 120.1. Likewise, holes produced in the intermediate connector 130.1 are injected towards the cathode and into the adjacent EL unit 120.2. Subsequently, these electrons and holes recombine in their corresponding EL units to produce light.

In order to fabricate a low voltage and a high efficiency tandem OLED, it is important to carefully design the thickness of each layer in each of the EL units and the intermediate connectors. Generally, the thickness of each layer in each of the EL units and the intermediate connectors is selected to satisfy the test condition that the voltage drop from the anode to the cathode of the tandem OLED is less than 4.0 V×N (the number of EL units) at 20 mA/cm$^2$, or selected to satisfy the test condition that the voltage drop from the anode to the cathode of the tandem OLED is less than 3.5 V×N at 1000 cd/m$^2$.

Figure 2:
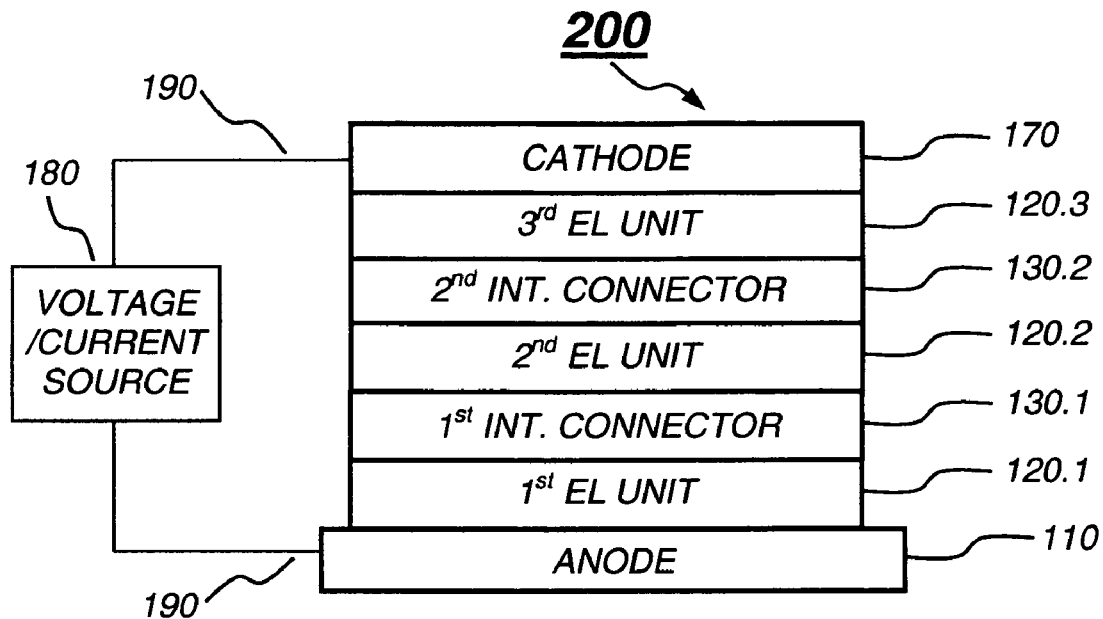
FIG. 2 depicts a schematic cross sectional view of a specific tandem OLED, having three EL units connected in series by two intermediate connector, in accordance with the present invention.

Shown in FIG. 2 is a tandem OLED 200. This tandem OLED has an anode 110 and a cathode 170, at least one of which is transparent. Disposed between the anode and the cathode are three EL units (EL units 120.1, 120.2, and 120.3) and two intermediate connectors (1$^{st}$ Int. Connector 130.1 and 2$^{nd}$ Int. Connector 130.2). The tandem OLED 200 is externally connected to a voltage/current source 180 through electrical conductors 190. The tandem OLED 200 is a tandem OLED simplified from FIG. 1.

In order to achieve a low drive voltage within this specific tandem OLED 200 shown in FIG. 2, the thickness of each layer in each of the EL units and the intermediate connectors is selected to satisfy the test condition that the voltage drop from the anode to the cathode of the tandem OLED is less than 12 V at 20 mA/cm$^2$, or selected to satisfy the test condition that the voltage drop from the anode to the cathode of the tandem OLED is less than 10.5 V at 1000 cd/m$^2$.

Each of the EL units in the tandem OLEDs 100 and 200 is capable of supporting hole injection, hole transport, electron injection, electron transport, and electron-hole recombination to produce light. Each of the EL units can comprise a plurality of layers. There are many organic EL multilayer structures known in the art that can be used as EL units of the present invention. These include, HTL/(LEL or LELs)/ETL, hole-injecting layer (HIL)/HTL/(LEL or LELs)/ETL, HIL/HTL/(LEL or LELs)/ETL/electron-injecting layer (EIL), HIL/HTL/electron-blocking layer or exciton-blocking layer/(LEL or LELs)/ETL/EIL, HIL/HTL/(LEL or LELs)/hole-blocking layer/ETL/EIL. Each of the EL units in the tandem OLED can have the same or different layer structures from other EL units provided that it can enable low drive voltage and high luminous efficiency. Preferably, the layer structure of the EL units is of HIL/HTL/(LEL or LELs)/ETL/EIL. Considering the number of the LELs within a specific EL unit in the tandem OLEDs 100 or 200, the number of LELs in each of the EL units can be changed typically from 1 to 3. Moreover, each of the EL units in the tandem OLED can emit the same or different color.

Figure 3:
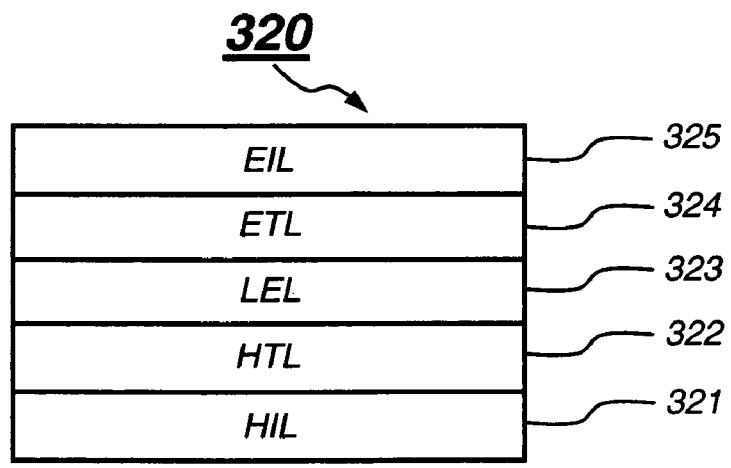
FIG. 3 depicts a schematic cross sectional view of a specific EL unit, having HIL, HTL, LEL, ETL, and EIL, in accordance with the present invention.

FIG. 3 shows one embodiment of the EL unit structures according to the present invention. EL unit 320 includes HIL 321, HTL 322, LEL 323, ETL 324, and EIL 325.

The HIL 321 in EL unit 320 is a p-type doped layer containing at least one hole-transporting material as a host material and at least one p-type dopant (this HIL can also be called a p-type doped HIL 321). The term "p-type doped layer" means that this layer has semiconducting properties after doping, and the electrical current through this layer is substantially carried by the holes. The host material is capable of supporting hole injection and hole transport. Hole-transporting materials used in conventional OLEDs represent a useful class of host materials for the p-type doped HIL 321. Preferred materials include aromatic tertiary amines having at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Other suitable triarylamines substituted with one or more vinyl radicals and/or comprising at least one active hydrogen-containing group are disclosed by Brantley, et al. in U.S. Pat. Nos. 3,567,450 and 3,658,520. A more preferred class of aromatic tertiary amines are those which include at least two aromatic tertiary amine moieties as described by Van Slyke, et al. in U.S. Pat. Nos. 4,720,432 and 5,061,569. Non-limiting examples include N,N'-di(naphthalene-1-yl)-N,N'-diphenyl-benzidine (NPB), N,N'-diphenyl-N,N'-bis(3-methylphenyl)-1,1-biphenyl-4,4'-diamine (TPD), and N,N,N',N'-tetranaphthyl-benzidine (TNB). The combination of the aforementioned materials is also useful to form the p-type doped layer. More preferably, the host material in the p-type doped HIL 321 includes NPB, TPD, TNB, 4,4',4"-tris(N-3-metylphenyl-N-phenyl-amino)-triphenylamine (m-TDATA), or 4,4',4"-tris(N,N-diphenyl-amino)-triphenylamine (TDATA), or hexaazatriphenylene compounds, or combinations thereof.

The p-type dopant in the p-type doped HIL 321 includes oxidizing agents with strong electron-withdrawing properties. By "strong electron-withdrawing properties" it is meant that the dopant should be able to accept some electronic charge from the host to form a charge-transfer complex with the host material. Some non-limiting examples include organic compounds such as 2,3,5,6-tetrafluoro-7,7,8,8-tetracyanoquinodimethane ($F_4$-TCNQ), other derivatives of 7,7,8,8-tetracyanoquinodimethane (TCNQ), and hexaazatriphenylene compounds, and inorganic oxidizing agents such as iodine, $FeCl_3$, $FeF_3$, $SbCl_5$, some other metal chlorides, and some other metal fluorides. Combining p-type dopants is also useful when forming the p-type doped HIL 321. The p-type dopant concentration is preferably in the range of 0.01–30 vol. %. The thickness of the p-type doped organic layer is typically less than 200 nm, and preferably in the range of less than 150 nm.

The HTL 322 in EL unit 320 contains at least one hole-transporting material such as an aromatic tertiary amine, where the aromatic tertiary amine is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel, et al. in U.S. Pat. No. 3,180,730. Other suitable triarylamines substituted with one or more vinyl radicals and/or comprising at least one active hydrogen-containing group are disclosed by Brantley, et al. in U.S. Pat. Nos. 3,567,450 and 3,658,520.

A more preferred class of aromatic tertiary amines are those which include at least two aromatic tertiary amine moieties as described by Van Slyke, et al. in U.S. Pat. Nos. 4,720,432 and 5,061,569. The HTL can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
4,4'-Bis(diphenylamino)quadriphenyl;
Bis(4-dimethylamino-2-methylphenyl)-phenylmethane;
N,N,N-Tri(p-tolyl)amine;
4-(di-p-tolylamino)-4'-[4(di-p-tolylamino)-styryl]stilbene;
N,N,N',N'-Tetra-p-tolyl-4-4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl;
4,4'-Bis[N-(1-naphthyl)-N-(2-naphthyl)amino]biphenyl;
4,4"-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis {N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amine]fluorene;
1,5-Bis[N-(1-naphthyl)-N-phenylamino]naphthalene; and
4,4',4"-tris[(3-methylphenyl)phenylamino]triphenylamine.

Another class of useful hole-transporting materials includes polycyclic aromatic compounds as described in EP 1 009 041. Tertiary aromatic amines with more than two amino groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As is noticed in the EL unit 320 of the tandem OLED in the present invention, both HIL 321 and HTL 322 can use the same or different hole-transporting materials.

The LEL 323 in EL unit 320 includes at least one host material doped with at least one dopant where EL is produced as a result of hole-electron recombination in this region, wherein the light emission comes primarily from the dopant and can be of red, green, blue, or white, or combinations thereof. The host material in the LEL can be an electron-transporting material, a hole-transporting material, or other material, or combinations of materials that support hole-electron recombination. The dopant is typically selected from highly fluorescent dyes, but phosphorescent compounds, e.g., transition metal complexes, are also useful. Dopants are typically coated as 0.01 to 20% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the electron energy band gap. For efficient energy transfer from the host to the dopant molecule, a necessary condition is that the band gap of the dopant is smaller than that of the host material. For phosphorescent emitters it is also important that the triplet energy level of the host be high enough to enable energy transfer from host to dopant.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato) aluminum(III)];

CO-2: Magnesium bisoxine [alias, bis(8-quinolinolato) magnesium(II)];

CO-3: Bis[benzo{f}-8-quinolinolato]zinc (II);

CO-4: Bis(2-methyl-8-quinolinolato)aluminum(III)-μ-oxo-bis(2-methyl-8-quinolinolato) aluminum(III);

CO-5: Indium trisoxine [alias, tris(8-quinolinolato)indium];

CO-6: Aluminum tris(5-methyloxine) [alias, tris(5-methyl-8-quinolinolato) aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Other classes of useful host materials include, but are not limited to, derivatives of anthracene, such as 2-(1,1-dimethyethyl)-9,10-bis(2-naphthalenyl) anthracene (TBADN), 9,10-di-(2-naphthyl) anthracene (ADN), and derivatives thereof as described in U.S. Pat. No. 5,935,721, distyrylarylene derivatives as described in U.S. Pat. No. 5,121,029, benzazole derivatives, for example, 2,2',2"-(1,3,5-phenylene)tris[1-phenyl-1H-benzimidazole], and blue emitting metal chelated oxinoid compounds, for example, Bis(2-methyl-8-quinolinolato)(4-phenylphenolato)aluminum (B-Alq). Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis (azinyl)methane compounds, and carbostyryl compounds.

The ETL 324 in EL unit 320 contains metal chelated oxinoid compounds, including chelates of oxine itself, also commonly referred to as 8-quinolinol or 8-hydroxyquinoline. Such compounds help to inject and transport electrons, exhibit high levels of performance, and are readily deposited to form thin films. Exemplary oxinoid compounds are the following:

CO-1: Aluminum trisoxine [alias, tris(8-quinolinolato)aluminum(III)];

CO-2: Magnesium bisoxine [alias, bis(8-quinolinolato)magnesium(II)];

CO-3: Bis[benzo {f}-8-quinolinolato]zinc (II);

CO-4: Bis(2-methyl-8-quinolinolato)aluminum(III)-μ-oxo-bis(2-methyl-8-quinolinolato) aluminum(III);

CO-5: Indium trisoxine [alias, tris(8-quinolinolato)indium];

CO-6: Aluminum tris(5-methyloxine) [alias, tris(5-methyl-8-quinolinolato) aluminum(III)];

CO-7: Lithium oxine [alias, (8-quinolinolato)lithium(I)];

CO-8: Gallium oxine [alias, tris(8-quinolinolato)gallium (III)]; and

CO-9: Zirconium oxine [alias, tetra(8-quinolinolato)zirconium(IV)].

Other electron-transporting materials include various butadiene derivatives as disclosed in U.S. Pat. No. 4,356,429 and various heterocyclic optical brighteners as described in U.S. Pat. No. 4,539,507. Benzazoles, oxadiazoles, triazoles, pyridinethiadiazoles, triazines, phenanthroline derivatives, and some silole derivatives are also useful electron-transporting materials.

The EIL 325 in EL unit 320 is an n-type doped layer containing at least one electron-transporting material as a host material and at least one n-type dopant (this EIL can also be called an n-type doped EIL 325). The term "n-type doped layer" means that this layer has semiconducting properties after doping, and the electrical current through this layer is substantially carried by the electrons. The host material is capable of supporting electron injection and electron transport. The electron-transporting materials used in conventional OLEDs represent a useful class of host materials for the n-type doped EIL 325. Preferred materials are metal chelated oxinoid compounds, including chelates of oxine itself (also commonly referred to as 8-quinolinol or 8-hydroxyquinoline), such as tris(8-hydroxyquinoline)aluminum (Alq). Other materials include various butadiene derivatives as disclosed by Tang in U.S. Pat. No. 4,356,429, various heterocyclic optical brighteners as disclosed by Van Slyke, et al. in U.S. Pat. No. 4,539,507, triazines, hydroxyquinoline derivatives, benzazole derivatives, and phenanthroline derivatives. Silole derivatives, such as 2,5-bis(2', 2"-bipridin-6-yl)-1,1-dimethyl-3,4-diphenyl silacyclopentadiene are also useful host organic materials. The combination of the aforementioned materials is also useful to form the n-typed doped EIL 325. More preferably, the host material in the n-type doped EIL 325 includes Alq, 4,7-diphenyl-1,10-phenanthroline (Bphen), 2,9-dimethyl-4,7-diphenyl-1,10-phenanthroline (BCP), or 2,2'-[1,1'-biphenyl]-4,4'-diylbis[4,6-(p-tolyl)-1,3,5-triazine] (TRAZ), or combinations thereof.

The n-type dopant in the n-type doped EIL 325 includes alkali metals, alkali metal compounds, alkaline earth metals, or alkaline earth metal compounds, or combinations thereof. The term "metal compounds" includes organometallic complexes, metal-organic salts, and inorganic salts, oxides and halides. Among the class of metal-containing n-type dopants, Li, Na, K, Rb, Cs, Mg, Ca, Sr, Ba, La, Ce, Sm, Eu, Th, Dy, or Yb, and their compounds, are particularly useful. The materials used as the n-type dopants in the n-type doped EIL 325 also include organic reducing agents with strong electron-donating properties. By "strong electron-donating properties" it is meant that the organic dopant should be able to donate at least some electronic charge to the host to form a charge-transfer complex with the host. Non-limiting examples of organic molecules include bis(ethylenedithio)-tetrathiafulvalene (BEDT-TTF), tetrathiafulvalene (TTF), and their derivatives. In the case of polymeric hosts, the dopant can be any of the above or also a material molecularly dispersed or copolymerized with the host as a minor component. Preferably, the n-type dopant in the n-type doped EIL 325 includes Li, Na, K, Rb, Cs, Mg, Ca, Sr, Ba, La, Ce, Nd, Sm, Eu, Th, Dy, or Yb, or combinations thereof. The n-type doped concentration is preferably in the range of 0.01–20 vol. %. The thickness of the n-type doped EIL 325 is typically less than 200 nm, and preferably in the range of less than 150 nm.

As is noticed that in the EL unit 320 of the tandem OLED in the present invention, both ETL 324 and EIL 325 can use the same or different electron-transporting material.

The layers in the EL unit 320 can be formed from small molecule OLED materials, polymeric LED materials, or inorganic materials, or combinations thereof. The corresponding layer in each of the EL units in the tandem OLED can be formed using the same or different materials from those of the other corresponding layers. Some EL units can be polymeric and other units can be of small molecules (or non-polymeric), including fluorescent materials and phosphorescent materials.

Using the aforementioned low voltage EL unit 320 cannot guarantee the formation of a low voltage tandem OLED. The intermediate connectors connecting each of the EL units in the tandem OLED also play an important role for achieving low voltage and high luminous efficiency in the device.

For a tandem OLED to function efficiently, it is necessary that the intermediate connector should provide effective carrier injection into the adjacent EL units. It is also necessary that the optical transparency of the layers constituting the intermediate connector should be as high as possible to permit for radiation produced in the EL units to exit the device. In the aforementioned tandem OLED according to the present invention, an organic intermediate connector can be formed when an HIL of an EL unit is in contact with the EIL of the preceding EL unit during the device fabrication process. This readily formed organic intermediate connector having an n-type doped organic EIL and a p-type doped organic HIL, denoted as EIL/HIL intermediate connector, can provide reasonably effective carrier injection into the adjacent EL units and have excellent optical transparency in the visible region of the spectrum. However, in order to fabricate a low voltage tandem OLED, the carrier injection capability of this EIL/HIL intermediate connector is not effective enough to further improve the carrier injection.

As is known, due to their lower resistivity than that of organic materials, metals, metal compounds, or other inorganic compounds can be effective for carrier injection. Therefore, if a metal layer, a metal compound layer, or other inorganic compound layer is used as an intermediate connector which has a thickness thin enough to meet the requirement of possessing high optical transparency, it is possible to further reduce the drive voltage of the tandem OLED.

In the present invention, each layer in each of the intermediate connectors can include organic material, a metal compound, or a high work function metal, or combinations thereof. "High work function metal" is defined as a metal having a work function no less than 4.0 eV. (Likewise, "low work function metal" is defined as a metal having a work function less than 4.0 eV). Preferably, each layer in each of the intermediate connectors includes a metal compound, or a high work function metal, or combinations thereof. Moreover, each layer in each of the intermediate connectors can be a doped layer or a non-doped layer. Furthermore, each of the intermediate connectors in the tandem OLED can be the same or different. In other words, each of the intermediate connectors can have the same or different layer structures.

Figure 4:
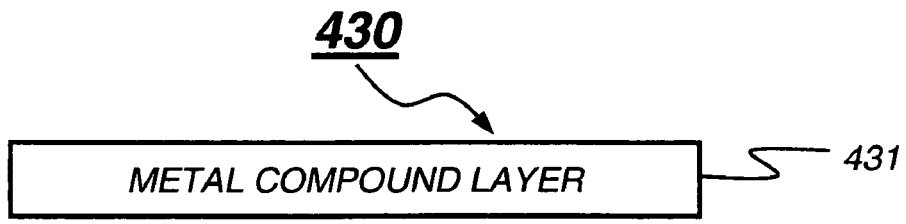
FIG. 4 depicts a schematic cross sectional view of an intermediate connector, having a metal compound layer, in the tandem OLED in accordance with the present invention.
Figure 5:
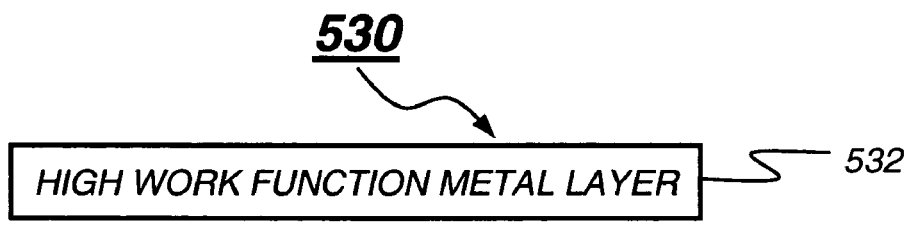
FIG. 5 depicts a schematic cross sectional view of another intermediate connector having a high work function metal layer in the tandem OLED in accordance with the present invention.
Figure 6:
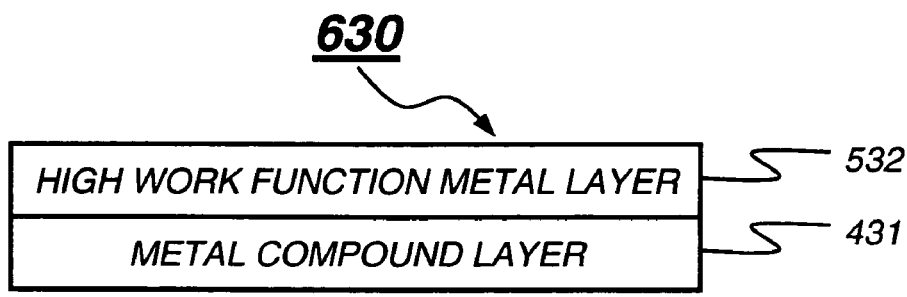
FIG. 6 depicts a schematic cross sectional view of another intermediate connector having a metal compound layer and a high work function metal layer in the tandem OLED in accordance with the present invention.

Shown from FIG. 4 to FIG. 6 are typical embodiments of the intermediate connectors for low drive voltage purpose in the present invention, wherein the intermediate connector disposed between each adjacent EL unit includes at least one layer and without direct connection to an external power source. FIG. 4 shows an intermediate connector 430 including a metal compound layer 431. FIG. 5 shows an intermediate connector 530 including a high work function metal layer 532. Shown in FIG. 6 is an intermediate connector 630 including both a metal compound layer 431 and a high work function metal layer 532. The high work function metal layer 532 is in contact with the metal compound layer 431. Either the metal compound layer 431 or the high work function metal layer 532 can be first deposited in contact with the preceding EL unit. In other words, the layer order of the intermediate connector 630 can be altered when this intermediate connector is disposed between two EL units. For example, Ag/MoO$_3$, MoO$_3$/Ag, Ag/WO$_3$, WO$_3$/Ag, and LiF/Al are included in the intermediate connector 630.

The metal compound layer 431 in the intermediate connectors 430 as shown in FIG. 4 and in the intermediate connector 630 as shown in FIG. 6 is mainly used to further improve the carrier injection. Moreover, this metal compound layer can also stop the possible interdiffusion or interaction between the n-typed doped EIL in the preceding EL unit and the p-type doped HIL of the adjacent EL unit to stabilize the drive voltage during operation. The metal compound layer 431 can be selected from the stoichiometric oxides or nonstoichiometric oxides of titanium, zirconium, hafnium, niobium, tantalum, molybdenum, tungsten, manganese, iron, ruthenium, rhodium, iridium, nickel, palladium, platinum, copper, zinc, silicon, or germanium, or combinations thereof. The metal compound layer 431 can be selected from the stoichiometric sulfides or nonstoichiometric sulfides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 431 can be selected from the stoichiometric selenides or nonstoichiometric selenides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 431 can be selected from the stoichiometric tellurides or nonstoichiometric tellurides of titanium, zirconium, hafnium, niobium, tantalum, molybdenum, tungsten, manganese, iron, ruthenium, rhodium, iridium, nickel, palladium, platinum, copper, silicon, or germanium, or combinations thereof. The metal compound layer 431 can be selected from the stoichiometric nitrides or nonstoichiometric nitrides of titanium, zirconium, hafnium, niobium, tantalum, molybdenum, tungsten, manganese, iron, ruthenium, rhodium, iridium, nickel, palladium, platinum, copper, zinc, gallium, silicon, or germanium, or combinations thereof. The metal compound layer 431 can also be selected from the stoichiometric carbides or nonstoichiometric carbides of titanium, zirconium, hafnium, niobium, tantalum, molybdenum, tungsten, manganese, iron, ruthenium, rhodium, iridium, nickel, palladium, platinum, copper, zinc, aluminum, silicon, or germanium, or combinations thereof. The metal compound layer 431 can also be selected from the stoichiometric carbides or nonstoichiometric fluorides of alkali metals when it was used with a metal capable of reducing the metal ion contained in the fluorides, such as Al, Zr, Ti, Y, Sc, or Si. The metal compound layer 431 can be selected from $MoO_3$, $NiMoO_4$, $CuMoO_4$, $WO_3$, ZnTe, $Al_4C_3$, $AlF_3$, $B_2S_3$, CuS, GaP, InP, or SnTe. Preferably, the metal compound layer 431 is selected from $MoO_3$, $NiMoO_4$, $CuMoO_4$, or $WO_3$.

The high work function metal layer 532 in the intermediate connectors 530 as shown in FIG. 5 and in the intermediate connector 630 as shown in FIG. 6 is mainly used to further improve the carrier injection. Moreover, this high work function metal layer can also stop the possible interdiffusion or interaction between the n-typed doped EIL in the preceding EL unit and the p-type doped HIL of the adjacent EL unit to stabilize the drive voltage during operation. The high work function metal used to form this layer has a work function no less than 4.0 eV and includes Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof. Preferably, the high work function metal layer 532 includes Cu, Ag, Au, Zn, Al, Zn, In, or Sn, or combinations thereof.

As aforementioned, in order to fabricate a low voltage and high efficiency tandem OLED, it is important to carefully design the thickness of each layer in each of the EL units and the intermediate connectors. It is desirable to make each of the EL units and the intermediate connectors as thin as possible. However, making an EL unit as thin as possible is not practically useful. From an optical out-coupling point of view, in order to achieve higher luminous efficiency, the optimal device thickness is mainly determined by the emission color. For example, giving a tandem OLED having an S-nm-thick ITO (on glass substrate) as a transparent anode, a Ag layer as an opaque cathode, an emission wavelength of $\lambda$ (nm), and N EL units, the optical distance from the LEL in the first EL unit adjacent to the anode to the glass/ITO interface is about $\lambda/2$, the distance between two LELs in the adjacent EL units is about $\lambda/2$, and the distance from the LEL of the $N^{th}$ EL unit adjacent to the cathode to the Ag cathode is about $0.672 \times \lambda/4$ (having considered the wavelength phase shift as about 122°). Therefore, the total optical distance (D(optical)) between glass/ITO interface and the Ag cathode surface is $D(optical)=N\times(\lambda/2)+0.672\times\lambda/4=(N/2+0.168)\times\lambda$. Provided that "n" is the average refractive index of all the organic materials and the ITO, the real optimal thickness can be obtained between the ITO/HIL interface and the Ag cathode surface $D(real)=D(optical)/n-S=(N/2+0.168)\times\lambda/n-S$. If N=1 (which means the tandem OLED has only one EL unit), $\lambda=524$ nm, n=1.75, and S=50 nm, D(real)=150 nm. This estimation tells us that the optimal thickness of the EL unit is about 150 nm for a green emissive device. If the thickness of an EL unit deviates too much from its optimal thickness, there will be interference of the light beams, which will reduce the out-coupling resulting in low luminous efficiency.

Figure 7:
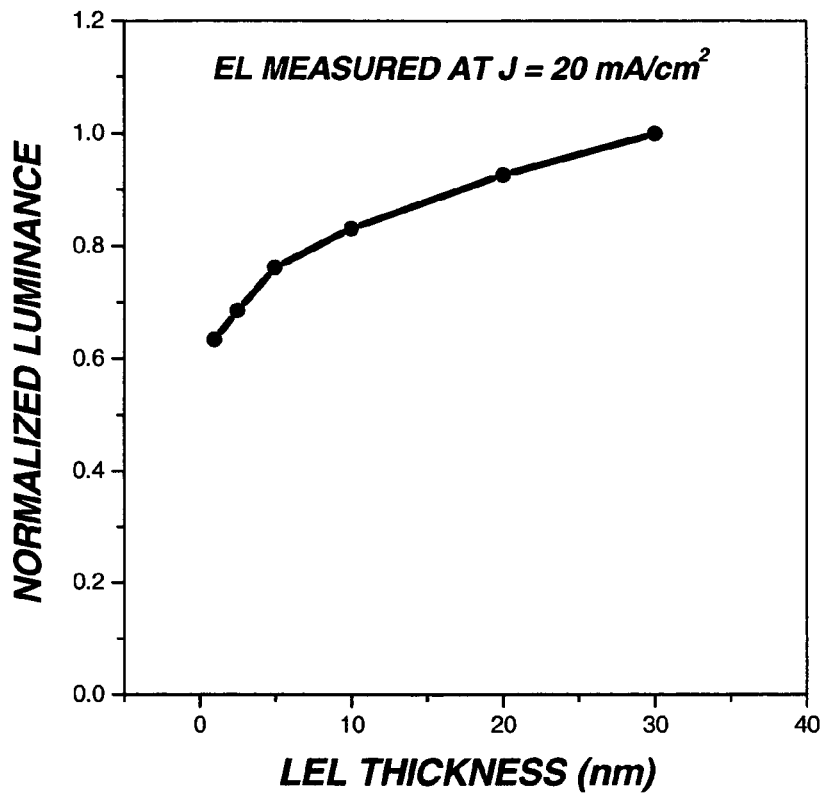
FIG. 7 is a graph of normalized luminance vs. the thickness of organic light-emitting layer in a conventional green color OLED.

With the optimal thickness in mind, it is then understood that the best way to reduce drive voltage is to increase the thickness of both the HIL and the EIL, and to decrease the thickness of the HTL, LELs, and ETL, while keeping the total thickness basically unchanged. Since it was reported that the exciton diffusion length is about 5 nm in an OLED, the thickness of the HTL and the ETL can be as thin as 5 nm to effectively block exciton diffusion from the LEL into the HIL or EIL and to maintain the radiative recombination rate in the LEL. In considering the thickness of the LEL, the width of the intensive emission zone needs to be known in the LEL before its thickness can properly be designed. FIG. 7 shows the relationship between the normalized luminance and the thickness of the LEL in a conventional green OLED. It indicates that more than 80% of the total luminance is occurring from the first 10 nm portion of the LEL near the HTL/LEL interface. It is known from our other experiments that the voltage drop in a doped EIL can be less than 0.02 V/nm, while the voltage drop in a non-doped ETL can be higher than 0.07 V/nm. Therefore, if the LEL thickness is reduced from 30 nm to 20 nm, the luminance decrease is less than 10%, while the voltage decrease can be more than 10% resulting in improved power efficiency.

Therefore, in the tandem OLED of the present invention, the HTL in contact with the LEL in each of the EL units can have a thickness of less than or equal to 10 nm, the LEL in each of the EL units can have a thickness of less than or equal to 20 nm, and the ETL in contact with the LEL in each of the EL units can have a thickness of less than or equal to 10 nm. Preferably, in the tandem OLED of the present invention, the HTL in contact with the LEL in each of the EL units can have a thickness of less than or equal to 5 nm, the LEL in each of the EL units can have a thickness of less than or equal to 15 nm, and the ETL in contact with the LEL in each of the EL units can have a thickness of less than or equal to 5 nm.

The thickness of each layer in each of the intermediate connectors is not very critical in terms of bulk resistance, and thicker intermediate connectors cannot cause much voltage increase because of their low resistivities. However, the thickness of each layer in each of the intermediate connectors is still important in terms of optical transparency. Therefore, in considering both carrier injection and optical transparency, the thickness of each layer in each of the intermediate connectors can be less than or equal to 5 nm. Preferably, the thickness of each layer in each of the intermediate connectors can be less than or equal to 3 nm.

The tandem OLED of the present invention is typically provided over a supporting substrate where either the cathode or anode can be in contact with the substrate. The electrode in contact with the substrate is conveniently referred to as the bottom electrode. Conventionally, the bottom electrode is the anode, but the present invention is not limited to that configuration. The substrate can either be light transmissive or opaque, depending on the intended direction of light emission. The light transmissive property is desirable for viewing the EL emission through the substrate. Transparent glass or plastic is commonly employed in such cases. For applications where the EL emission is viewed through the top electrode, the transmissive characteristic of the bottom support is immaterial, and therefore can be light transmissive, light absorbing, or light reflective. Substrates for use in this case include, but are not limited to, glass, plastic, semiconductor materials, silicon, ceramics, and circuit board materials. Of course, it is necessary to provide in these device configurations a light-transparent top electrode.

When EL emission is viewed through anode 110, the anode should be transparent, or substantially transparent, to the emission of interest. Common transparent anode materials used in the present invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and any conductive material can be used, regardless if it is transparent, opaque, or reflective. Example conductors for this application include, but are not limited to, gold, iridium, molybdenum, palladium, and platinum. Typical anode materials, transmissive or otherwise, have a work function no less than 4.0 eV. Desired anode materials are commonly deposited by any suitable way such as evaporation, sputtering, chemical vapor deposition, or electrochemical means. Anodes can be patterned using well known photolithographic processes. Optionally, anodes can be polished prior to the deposition of other layers to reduce surface roughness so as to reduce electrical shorts or enhance reflectivity.

When light emission is viewed solely through the anode, the cathode 170 used in the present invention can be comprised of nearly any conductive material. Desirable materials have effective film-forming properties to ensure effective contact with the underlying organic layer, promote electron injection at low voltage, and have effective stability. Useful cathode materials often contain a low work-function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin inorganic EIL in contact with an organic layer (e.g., organic EIL, or organic ETL), which is capped with a thicker layer of a conductive metal. Here, the inorganic EIL preferably includes a low work-function metal or metal salt and, if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861, 5,059,862, and 6,140,763.

When light emission is viewed through the cathode, the cathode should be transparent or nearly transparent. For such applications, metals should be thin or one should use transparent conductive oxides, or include these materials. Optically transparent cathodes have been described in more detail in U.S. Pat. Nos. 4,885,211, 5,247,190, 5,703,436, 5,608,287, 5,837,391, 5,677,572, 5,776,622, 5,776,623, 5,714,838, 5,969,474, 5,739,545, 5,981,306, 6,137,223, 6,140,763, 6,172,459, 6,278,236, 6,284,393, JP 3,234,963, and EP 1 076 368. Cathode materials are typically deposited by thermal evaporation, electron beam evaporation, ion sputtering, or chemical vapor deposition. When needed, patterning can be achieved through many well known methods including, but not limited to, through-mask deposition, integral shadow masking, for example as described in U.S. Pat. No. 5,276,380 and EP 0 732 868, laser ablation, and selective chemical vapor deposition.

The EL units and the intermediate connectors can be produced by thermal evaporation, electron beam evaporation, ion sputtering technique, or spin coating. Preferably, a thermal evaporation method is used for the deposition of all the materials in the fabrication of the tandem OLED including the EL units, the intermediate connectors, and the electrode over the top EL unit.

Most OLEDs are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

In order to measure the EL characteristics of the devices, the following test condition was set up for use in the present invention:

1. Computerized Test Method:

a) measuring the emission size (Z) of the OLED to be tested. An optical microscope, luminescence microscope, or an imaging detector, or other suitable tools can be used to measure the emission size of the OLED. The emission size will be used to calculate the applied current density;

b) measuring the lead resistance ($R_{lead}$) from the anode of the OLED to the positive test contact, and from the cathode of the OLED to the negative test contact. If the lead resistance is measurable, a voltage drop on the lead ($V_{lead}$) needs to be taken away from the voltage measurement value;

c) using a calibrated KEITHLEY 2400 SourceMeter as a voltage/current current source, using a calibrated PHOTO RESEARCH SpectraScan PR 650 as a photometer, using suitable software in a computer to control the communication among the voltage/current source, the photometer, a printer, and the computer;

d) arranging a test setup as shown in FIG. 8, wherein the setup 800 includes computer 801, voltage/current source 802, photometer 803, sample holder 804, printer 805, communication line 806, and electrical conductor 807;

e) mounting the OLED onto a sample holder at room temperature, wherein two electrical conductors from the output of the voltage/current source are connected to the OLED in such a way that the positive test contact connecting to the anode of the OLED is well connected to the positive electrical conductor and the negative test contact connecting to the cathode of the OLED is well connected to the negative electrical conductor, so that forward bias (directed current) can be applied on to the OLED; and making sure that the photometer is focused on the emission surface of the OLED perpendicularly and there is no color filter or optical polarizer between the photometer and the emission surface of the OLED except the transparent substrate to hold the OLED;

f) presetting a series of testing current densities (J), such as, J=0.5, 1.0, 2.0, 6.0, 20, 40, and 100 mA/cm$^2$, imputing the test current (I)=J×Z into the testing program, running the computer program to measure the luminance-current-voltage characteristics at room temperature; and obtaining a series of voltage (V) and luminance (L) values corresponding to the given current density, from which the current density-voltage (J-V) curve and the luminance-voltage (L-V) curve can be plotted by the computer and printed from the printer;

g) determining the voltage ($V_{oled}$) across the anode and the cathode of the OLED, $V_{oled}=V-I\times R_{lead}$, if the "$I\times R_{lead}$" is not negligible;

h) plotting J-$V_{oled}$ curve and L-$V_{oled}$ curve;

i) obtaining the $V_{oled}$ value corresponding to 20 mA/cm$^2$ and $V_{oled}$ corresponding to 1000 cd/m$^2$ from the J-$V_{oled}$ curve and L-$V_{oled}$ curve, respectively; and j) repeating the steps from e) to h) by 3 times, and the average $V_{oled}$ value corresponding to 20 mA/cm$^2$ and the average $V_{oled}$ corresponding to 1000 cd/m$^2$ can finally be obtained.

2. Manual Test Method:

a) measuring the emission size (Z) of the OLED to be tested. An optical microscope, luminescence microscope, or CCD imagine detector, or other suitable tools can be used to measure the emission size of the OLED. The emission size will be used to calculate the applied current density;

b) measuring the lead resistance ($R_{lead}$) from the anode of the OLED to the positive test contact, and from the cathode of the OLED to the negative test contact. If the lead resistance is measurable, a voltage drop on the lead ($V_{lead}$) needs to be taken away from the voltage measurement value;

c) using any calibrated voltage/current source, but preferably using a KEITHLEY 2400 SourceMeter as a voltage/current current source, applying a directed current $I_o (I_o=20$ mA/cm$^2 \times Z$) as a forward bias on the OLED in such a way that the positive test contact connecting to the anode of the OLED is well connected to the positive electrical conductor of the source and the negative test contact connecting to the cathode of the OLED is well connected to the negative electrical conductor of the source; obtaining and recording the corresponding voltage reading ($V_o$); calculating the voltage drop ($V_{oled}$) across the OLED, $V_{oled}=V_o-I_o \times R_{lead}$;

d) using any calibrated photometer, but preferably using a calibrated PHOTO RESEARCH SpectraScan PR 650 as a photometer; making sure that the photometer is focused on the emission surface of the OLED perpendicularly and there is no color filter or optical polarizer between the photometer and the emission surface of the OLED except the transparent substrate to hold the OLED; applying directed current as a forward bias on the OLED as aforementioned on step c) and slowly tuning the current (I) up, at the same time measuring the luminance (L) from the emission surface; recording the I and V from the voltage/current source when L=1000 cd/m$^2$ is obtained from the photometer; and calculating the voltage drop ($V_{oled}$) across the OLED, $V_{oled}=V-I \times R_{lead}$; and e) repeating the steps from c) to d) by 3 times, and the average $V_{oled}$ value corresponding to 20 mA/cm$^2$ and the average $V_{oled}$ corresponding to 1000 cd/m$^2$ can be finally obtained.

For example, there is an OLED for test. Its emission area is measured as Z=10 mm$^2$ and its lead resistance is measured as 500 Ω. In order to obtain a voltage reading at 20 mA/cm$^2$, a directed current of I=2 mA (I=J×Z=20 mA/cm$^2$×10 mm$^2$=2 mA) from a KEITHLEY 2400 SourceMeter is applied as a forward bias to the device through the leads. The voltage reading is 4.8 V corresponding to 2 mA. Therefore, the voltage drop from the anode to the cathode of the OLED at the test condition of 20 mA/cm$^2$ is $V_{oled}=V-I \times R_{lead}=4.8$ V−2 mA×500 Ω=3.8 V.

EXAMPLES

The following examples are presented for a further understanding of the present invention. In the following examples, the thickness of the organic layers and the doping concentrations were controlled and measured in situ using calibrated thickness monitors (INFICON IC/5 Deposition Controller). The EL characteristics of all the fabricated devices were evaluated using a constant current source (KEITHLEY 2400 SourceMeter) and a photometer (PHOTO RESEARCH SpectraScan PR 650) at the room temperature. The color will be reported using Commission Internationale de l'Eclairage (CIE) coordinates.

Example 1 (Comparative)

The preparation of a conventional OLED is as follows: A ~1.1 mm thick glass substrate coated with a transparent indium-tin-oxide (ITO) conductive layer was cleaned and dried using a commercial glass scrubber tool. The thickness of ITO is about 42 nm and the sheet resistance of the ITO is about 68 Ω/square. The ITO surface was subsequently treated with oxidative plasma to condition the surface as an anode. A layer of CFx, 1 nm thick, was deposited on the clean ITO surface as the hole-injecting layer by decomposing CHF$_3$ gas in an RF plasma treatment chamber. The substrate was then transferred into a vacuum deposition chamber for deposition of all other layers on top of the substrate. The following layers were deposited in the following sequence by evaporation from a heated boat under a vacuum of approximately 10$^{-6}$ Torr:

1. EL Unit:
   a) an HTL, 100 nm thick, including "4,4'-bis[N-(1-naphthyl)-N-phenylamino]biphenyl" (NPB);
   b) a LEL, 20 nm thick, including "tris(8-hydroxyquinoline)-aluminum" (Alq) doped with 1.0 vol % 10-(2-benzothiazolyl)-1,1,7,7-tetramethyl-2,3,6,7-tetrahydro-1H,5H,11H(1)benzopyrano(6,7,8-ij)quinolizin-11-one (C545T); and
   c) an ETL, 40 nm thick, including Alq.

2. Cathode: approximately 210 nm thick, including MgAg (formed by coevaporation of about 95 vol. % Mg and 5 vol. % Ag).

After the deposition of these layers, the device was transferred from the deposition chamber into a dry box (VAC Vacuum Atmosphere Company) for encapsulation. The OLED has an emission area of 10 mm$^2$.

This conventional OLED requires a drive voltage of about 6.8 V to pass 20 mA/cm$^2$. Under this test condition, the device has a luminance of 2164 cd/m$^2$, and a luminous efficiency of about 10.8 cd/A. Its CIEx and CIEy are 0.284, 0.653, respectively, with an emission peak at 520 nm. The EL performance data are summarized in Table 1. The EL unit in this device is a three-layer structure without a HIL and EIL. As a result, its drive voltage is higher than 4.0 V under the test condition of 20 mA/cm$^2$.

Example 2 (Comparative)

A tandem OLED was constructed with the similar fabrication methods to those used in Example 1, and the deposited layer structure is:

1. 1$^{st}$ EL Unit:
   a) an HTL, 100 nm thick, including NPB;
   b) a LEL, 20 nm thick, including Alq doped with 1.0 vol % C545T;
   c) an ETL, 10 nm thick, including Alq; and
   d) an EIL, 30 nm thick, including Alq doped with 1.2 vol % lithium.

2. 1$^{st}$ Intermediate Connector:
   An EIL/HIL organic intermediate connector will be automatically formed after completing the 2$^{nd}$ EL unit.

3. 2$^{nd}$ EL Unit:
   e) an HIL, 65 nm thick, including NPB doped with 4 vol % 2,3,5,6-tetrafluoro-7,7,8,8-tetracyanoquinodimethane (F$_4$-TCNQ);
   f) an HTL, 20 nm thick, including NPB;
   g) a LEL, 20 nm thick, including Alq doped with 1.0 vol % C545T; and
   h) an ETL, 40 nm thick, including Alq.

4. Cathode: approximately 210 nm thick, including MgAg.

This tandem OLED requires a drive voltage of about 15.9 V to pass 20 mA/cm$^2$. Under this test condition, the device has a luminance of 4690 cd/m$^2$, and a luminous efficiency of about 23.5 cd/A. Its CIEx and CIEy are 0.290, 0.659, respectively, with an emission peak at 524 nm. The EL performance data are summarized in Table 1. The two EL units in this tandem OLED are the same as the EL unit in Example 1 except that the layers d) and e) form an EIL/HIL organic intermediate connector between the two EL units. Compared to the device in Example 1, both the drive voltage and the luminous efficiency of this tandem OLED in Example 2 are more than double of those the device in Example 1. Since the drive voltage of the device in Example 1 is about 6.8 V under the test condition of 20 mA/cm$^2$, the drive voltage of the device in Example 2 should be about 6.8×2=13.6 V under the test condition of 20 mA/cm$^2$ if there were no voltage drop across the EIL/HIL organic intermediate connector. However, there are an extra 2.3 V across the device, which can indicate that the EIL/HIL organic intermediate connector does not have optimal carrier injection capability. Therefore, it is predicted that even if each of the EL units has low drive voltage when it is used to form a conventional OLED, the tandem OLED having these EL units may not be able to achieve low voltage by only using the EIL/HIL organic intermediate connector in the device.

Example 3 (Comparative)

Another conventional OLED was constructed with the similar fabrication methods to those used in Example 1, and the deposited layer structure is:

1. EL Unit:
   a) an HIL, 95 nm thick, including 4,4',4"-tris(N-3-metylphenyl-N-phenyl-amino)-triphenylamine (m-TDATA);
   b) an HTL, 10 nm thick, including NPB;
   c) a LEL, 20 nm thick, including Alq;
   d) an ETL, 10 nm thick, including Alq; and
   e) an EIL, 30 nm thick, including Alq doped with 1.2 vol % lithium.

2. Cathode: approximately 210 nm thick, including MgAg (formed by coevaporation of about 95 vol. % Mg and 5 vol. % Ag).

This conventional OLED requires a drive voltage of about 6.4 V to pass 20 mA/cm$^2$. Under this test condition, the device has a luminance of 943 cd/m$^2$, and a luminous efficiency of about 4.7 cd/A. Its CIEx and CIEy are 0.332, 0.559, respectively, with an emission peak at 528 nm. The EL performance data are summarized in Table 1. Although the EL unit in this device is a five-layer structure with an HIL and an EIL, the HIL and the EIL are not doped with p-type dopant and n-type dopant, respectively. Therefore, the conductivity of the HIL and the EIL is not high enough resulting in high drive voltage in this device.

Example 4 (Comparative)

Another tandem OLED was constructed with the similar fabrication methods to those used in Example 1, and the deposited layer structure is:

1. 1$^{st}$ EL Unit:
   The 1$^{st}$ EL unit is the same as the EL unit in Example 3.

2. 1$^{st}$ Intermediate Connector:
   a) a metal compound layer, 10 nm thick, including MoO$_3$.

3. 2$^{nd}$ EL Unit:
   The 2$^{nd}$ EL unit is the same as the 1$^{st}$ EL unit except that the thickness of the HIL is 70 nm, instead of 95 nm, for optical out-coupling consideration.

4. Cathode: approximately 210 nm thick, including MgAg.

This tandem OLED requires a drive voltage of about 16.0 V to pass 20 mA/cm$^2$. Under this test condition, the device has a luminance of 1995 cd/m$^2$, and a luminous efficiency of about 10.0 cd/A. Its CIEx and CIEy are 0.332, 0.582, respectively, with an emission peak at 532 nm. The EL performance data are summarized in Table 1. The two EL units in this tandem OLED are the same as the EL unit in Example 3, and are connected by an intermediate connector containing a MoO$_3$ layer. Compared to the device in Example 3, both the drive voltage and the luminous efficiency of this 2-EL unit tandem OLED in Example 4 are more than double of those of the device in Example 3. However, this tandem OLED is not considered to be a low voltage tandem OLED because its drive voltage under the test condition of 20 mA/cm$^2$ is much higher than 8.0 V.

Example 5

A low voltage OLED was constructed with the similar fabrication methods to those used in Example 1, and the deposited layer structure is:

1. EL Unit:
   a) an HIL, 70 nm thick, including m-TDATA doped with 4 vol % F$_4$-TCNQ;
   b) an HTL, 5 nm thick, including NPB;
   c) a LEL, 12 nm thick, including Alq doped with 1.0 vol % C545T;
   d) an ETL, 5 nm thick, including 4,7-diphenyl-1,10-phenanthroline (Bphen); and
   e) an EIL, 40 nm thick, including Bphen doped with about 1.5 vol % lithium.

2. Cathode: approximately 210 nm thick, including MgAg (formed by coevaporation of about 95 vol. % Mg and 5 vol. % Ag).

Figure 9:
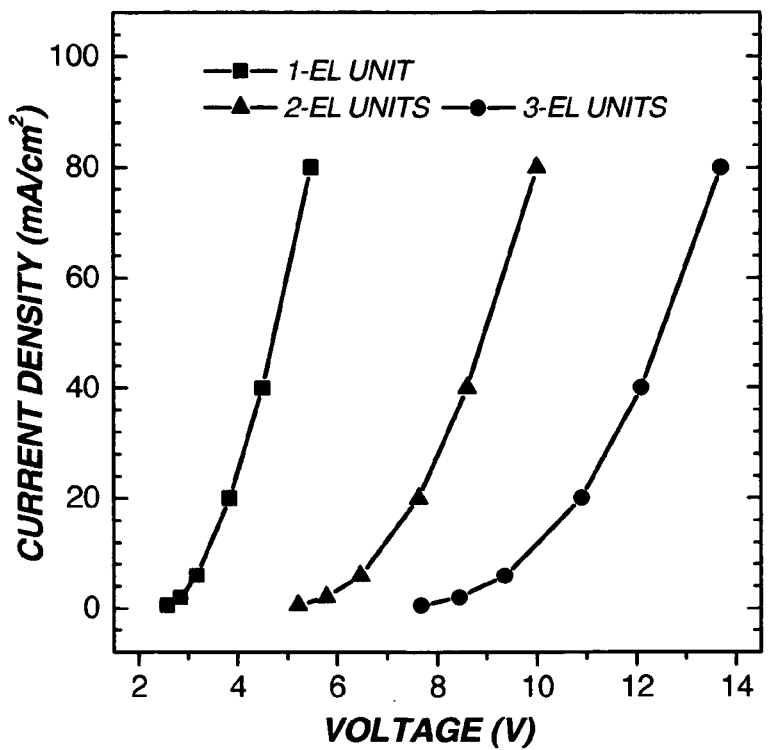
FIG. 9 is a graph showing the current density-voltage (J-V) characteristics of the Examples 5–7 in accordance with the present invention.
Figure 10:
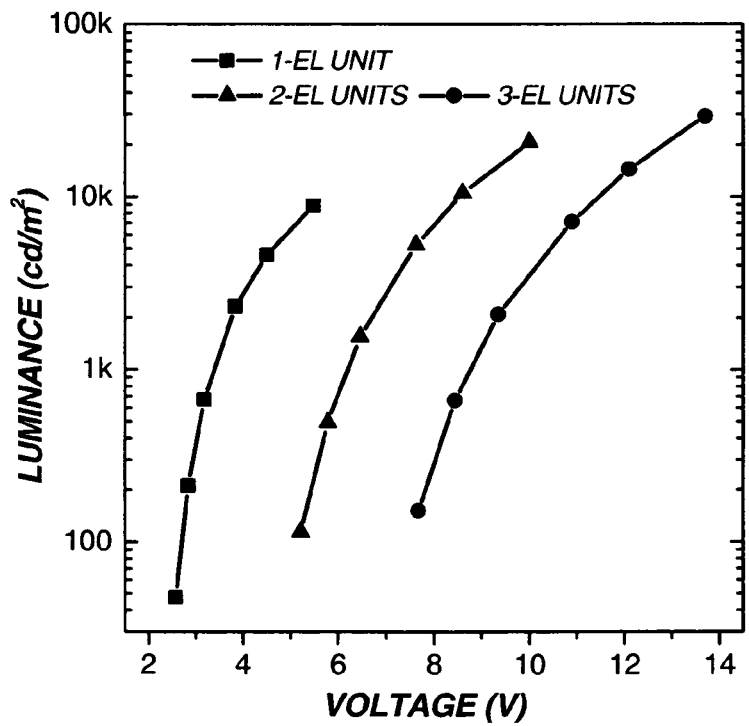
FIG. 10 is a graph showing the luminance-voltage (J-V) characteristics of the Examples 5–7 in accordance with the present invention.
Figure 11:
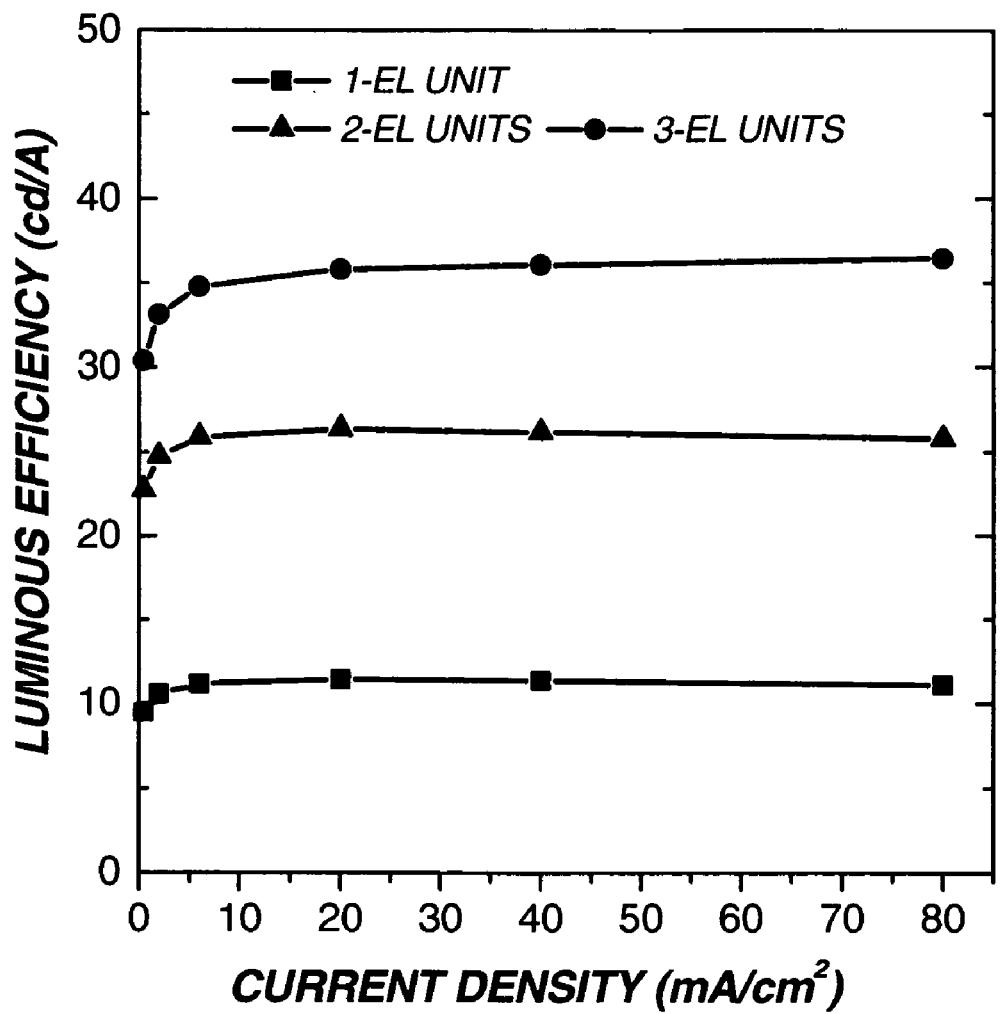
FIG. 11 is a graph showing the luminous efficiency-current density ($\eta$-J) characteristics of the Examples 5–7 in accordance with the present invention.

This OLED requires a drive voltage of about 3.8 V to pass 20 mA/cm$^2$. Under this test condition, the device has a luminance of 2298 cd/m$^2$, and a luminous efficiency of about 11.5 cd/A. Its CIEx and CIEy are 0.289, 0.649, respectively, with an emission peak at 521 nm. Moreover, the drive voltage is about 3.5 V under the test condition of 1000 cd/m$^2$. The EL performance data are summarized in Table 1. Its current density—voltage (J-V) curve, luminance—voltage (L-V) curve, and luminous efficiency—current density ($\eta$-J) curve are shown in FIGS. 9, 10, and 11, respectively. The EL unit in this device has a five-layer structure with a p-type doped HIL and an n-typed doped EIL, wherein the doped HIL and doped EIL can effectively reduce the drive voltage. Compared to the conventional device in Example 1 (Device 1), although the drive voltage of the device in this Example (Device 5) is 3 V lower than that of Device 1 under the test condition of 20 mA/cm$^2$, and the LEL thickness is 7 nm thinner than that of Device 1, the luminous efficiency is still higher than that of Device 1. Since the drive voltage of Device 5 is lower than 4.0 V under the test condition of 20 mA/cm$^2$, and is about 3.5 V under the test condition of 1000 cd/m$^2$, this OLED is considered to be a low voltage OLED. A low voltage tandem OLED might be formed using this EL unit.

Example 6

A tandem OLED according to the present invention was constructed with the similar fabrication methods to those used in Example 1, and the deposited layer structure is:

1. 1st EL Unit:
    The 1st EL unit is the same as the EL unit in Example 5.
2. 1st Intermediate Connector:
    a) a metal compound layer, 2 nm thick, including $WO_3$.
3. 2nd EL Unit:
    The 2nd EL unit is the same as the 1st EL unit except that the thickness of the HIL is 80 nm, instead of 70 nm, for optical out-coupling consideration.
4. Cathode: approximately 210 nm thick, including MgAg.

This tandem OLED requires a drive voltage of about 7.6 V to pass 20 mA/cm². Under this test condition, the device has a luminance of 5266 cd/m², and a luminous efficiency of about 26.3 cd/A. Its CIEx and CIEy are 0.285, 0.657, respectively, with an emission peak at 522 nm. Moreover, the drive voltage is about 6.2 V under the test condition of 1000 cd/m². The EL performance data are summarized in Table 1. Its J-V curve, L-V curve, and η-J curve are shown in FIGS. 9, 10, and 11, respectively. Since the drive voltage is lower than 4.0 V×2=8.0 V under the test condition of 20 mA/cm², and is lower than 3.5 V×2=7.0 V under the test condition of 1000 cd/m², this 2-EL unit tandem OLED is considered a low voltage tandem OLED.

Example 7

Another tandem OLED according to the present invention was constructed with the similar fabrication methods to those used in Example 1, and the deposited layer structure is:

1. 1st EL Unit:
    The 1st EL unit is the same as the EL unit in Example 5.
2. 1st Intermediate Connector:
    a) a metal compound layer, 2 nm thick, including $WO_3$.
3. 2nd EL Unit:
    The 2nd EL unit is the same as the 1st EL unit except that the thickness of the HIL is 80 nm, instead of 70 nm, for optical out-coupling consideration.
4. 2nd Intermediate Connector:
    a) a metal compound layer, 2 nm thick, including $WO_3$.
5. 3rd EL Unit:
    The 3rd EL unit is the same as the 2nd EL unit in this Example.
6. Cathode: approximately 210 nm thick, including MgAg.

This tandem OLED requires a drive voltage of about 10.9 V to pass 20 mA/cm². Under this test condition, the device has a luminance of 7147 cd/m², and a luminous efficiency of about 35.8 cd/A. Its CIEx and CIEy are 0.272, 0.667, respectively, with an emission peak at 522 nm. Moreover, the drive voltage is about 8.7 V under the test condition of 1000 cd/m². The EL performance data are summarized in Table 1. Its J-V curve, L-V curve, and η-J curve are shown in FIGS. 9, 10, and 11, respectively. Since the drive voltage is lower than 4.0 V×3=12.0 V under the test condition of 20 mA/cm², and is lower than 3.5 V×3=10.5 V under the test condition of 1000 cd/m², this 3-EL unit tandem OLED is considered a low voltage tandem OLED which is suitable for the common TFT drive circuitry.

Shown in Table 1 is the summary of the EL performance of the examples discussed above.

TABLE 1

| Example(Type) (EL measured at 20 mA/cm²) | Voltage (V) | Luminance (cd/m²) | Luminous Efficiency (cd/A) | CIE x (1931) | CIE y (1931) | Peak (nm) |
| --- | --- | --- | --- | --- | --- | --- |
| 1 (Comparative) | 6.8 | 2164 | 10.8 | 0.284 | 0.653 | 520 |
| 2 (Comparative) | 15.9 | 4690 | 23.5 | 0.290 | 0.659 | 524 |
| 3 (Comparative) | 6.4 | 943 | 4.7 | 0.332 | 0.559 | 528 |
| 4 (Comparative) | 16.0 | 1995 | 10.0 | 0.332 | 0.582 | 532 |
| 5 | 3.8 | 2298 | 11.5 | 0.289 | 0.649 | 521 |
| 6 | 7.6 | 5266 | 26.3 | 0.285 | 0.657 | 522 |
| 7 | 10.9 | 7174 | 35.8 | 0.272 | 0.667 | 522 |

The invention has been described in detail with particular reference to certain preferred embodiments thereof, but it will be understood that variations and modifications can be effected within the spirit and scope of the invention.

PARTS LIST 100 tandem OLED
110 anode
120.1 1st EL unit
120.2 2nd EL unit
120.3 3rd EL unit
120.(N−1) (N−1)th EL unit
120.N Nth EL unit
130.1 1st intermediate connector (or 1st int. connector)
130.2 2nd intermediate connector (or 2nd int. connector)
130.(N−1) (N−1)th intermediate connector (or (N−1)th int. connector)
170 cathode
180 voltage/current source
190 electrical conductors
200 tandem OLED having three EL units
320 EL unit
321 hole-injecting layer (or HIL)
322 hole-transporting layer (or HTL)
323 light-emitting layer (or LEL)
324 electron-transporting layer (or ETL)
325 electron-injecting layer (or EIL)
430 intermediate connector
431 metal compound layer
530 intermediate connector
532 high work function metal layer
630 intermediate connector
800 computerized test setup
801 computer
802 voltage/current source
803 photometer
804 sample holder
805 printer 806 communication line
807 electrical conductor

The invention claimed is:

1. A tandem OLED comprising:
   a) an anode;
   b) a cathode;
   c) at least two electroluminescent units disposed between the anode and the cathode, wherein each of the electroluminescent units includes at least one hole-injecting layer, one hole-transporting layer, one organic light-emitting layer, one electron-transporting layer, and one electron-injecting layer;
   d) at least one intermediate connector, wherein each of the intermediate connectors includes at least one layer, and wherein each of the intermediate connectors is disposed between electroluminescent units; and
   e) wherein the thickness of each layer in each of the electroluminescent units and the intermediate connectors is selected to provide high luminous efficiency using optical out-coupling while satisfying the test condition that the voltage drop from the anode to the cathode is less than 4.0 V×N (the number of electroluminescent units) at 20 mA/cm$^2$.

2. The tandem OLED of claim 1 wherein there are three electroluminescent units disposed between the anode and the cathode, wherein each of the electroluminescent units includes at least one hole-injecting layer, one hole-transporting layer, one organic light-emitting layer, one electron-transporting layer, and one electron-injecting layer and two intermediate connectors, wherein each of the intermediate connectors includes at least one layer, and wherein each of the intermediate connectors is disposed between electroluminescent units, and the thickness of each layer in each of the electroluminescent units and the intermediate connectors is selected to provide high luminous efficiency using optical out-coupling while satisfying the test condition that the voltage drop from the anode to the cathode is less than 12 V at 20 mA/cm$^2$.

3. The tandem OLED of claim 1 wherein the hole-transporting layer in contact with the organic light-emitting layer in each of the electroluminescent units has a thickness of less than or equal to 10 nm, wherein the organic light-emitting layer in each of the electroluminescent units has a thickness of less than or equal to 20 nm, wherein the electron-transporting layer in contact with the organic light-emitting layer in each of the electroluminescent units has a thickness of less than or equal to 10 nm, and wherein each of the layers in each of the intermediate connectors has a thickness of less than or equal to 5 nm.

4. The tandem OLED of claim 1 wherein the hole-transporting layer in contact with the organic light-emitting layer in each of the electroluminescent units has a thickness of less than or equal to 5 nm, wherein the organic light-emitting layer in each of the electroluminescent units has a thickness of less than or equal to 15 nm, wherein the electron-transporting layer in contact with the organic light-emitting layer in each of the electroluminescent units has a thickness of less than or equal to 5 nm, and wherein each of the layers in each of the intermediate connectors has a thickness of less than or equal to 3 nm.

5. A tandem OLED comprising:
   a) an anode;
   b) a cathode;
   c) at least two electroluminescent units disposed between the anode and the cathode, wherein each of the electroluminescent units includes at least one hole-injecting layer, one hole-transporting layer, one organic light-emitting layer, one electron-transporting layer, and one electron-injecting layer;
   d) at least one intermediate connector, wherein each of the intermediate connectors includes at least one layer, and wherein each of the intermediate connectors is disposed between electroluminescent units; and
   e) wherein the thickness of each layer in each of the electroluminescent units and the intermediate connectors is selected to provide high luminous efficiency using optical out-coupling while satisfying the test condition that the voltage drop from the anode to the cathode is less than 3.5 V×N at 1000 cd/m$^2$.

6. The tandem OLED of claim 5 wherein there are three electroluminescent units disposed between the anode and the cathode, wherein each of the electroluminescent units includes at least one hole-injecting layer, one hole-transporting layer, one organic light-emitting layer, one electron-transporting layer, and one electron-injecting layer and two intermediate connectors, wherein each of the intermediate connectors includes at least one layer, and wherein each of the intermediate connectors is disposed between electroluminescent units, and the thickness of each layer in each of the electroluminescent units and the intermediate connectors is selected to provide high luminous efficiency using optical out-coupling while satisfying the test condition that the voltage drop from the anode to the cathode is less than 10.5 V at 1000 cd/m$^2$.

7. The tandem OLED of claim 5 wherein the hole-transporting layer in contact with the organic light-emitting layer in each of the electroluminescent units has a thickness of less than or equal to 10 nm, wherein the organic light-emitting layer in each of the electroluminescent units has a thickness of less than or equal to 20 nm, wherein the electron-transporting layer in contact with the organic light-emitting layer in each of the electroluminescent units has a thickness of less than or equal to 10 nm, and wherein each of the layers in each of the intermediate connectors has a thickness of less than or equal to 5 nm.

8. The tandem OLED of claim 5 wherein the hole-transporting layer in contact with the organic light-emitting layer in each of the electroluminescent units has a thickness of less than or equal to 5 nm, wherein the organic light-emitting layer in each of the electroluminescent units has a thickness of less than or equal to 15 nm, wherein the electron-transporting layer in contact with the organic light-emitting layer in each of the electroluminescent units has a thickness of less than or equal to 5 nm, and wherein each of the layers in each of the intermediate connectors has a thickness of less than or equal to 3 nm.

9. The tandem OLED of claim 1 wherein the hole-injecting layer in each of the electroluminescent units is a p-type doped layer containing at least one hole-transporting material and at least one p-type dopant.

10. The tandem OLED of claim 9 wherein the hole-transporting material includes N,N'-di(naphthalene-1-yl)-N,N'-diphenyl-benzidine (NPB), N,N'-diphenyl-N,N'-bis(3-methylphenyl)-1,1-biphenyl-4,4'-diamine (TPD), N,N,N',N'-tetranaphthyl-benzidine (TNB), 4,4',4"-tris(N-3-metylphenyl-N-phenyl-amino)-triphenylamine (m-MTDATA), 4,4',4"-tris(N,N-diphenyl-amino)-triphenylamine (TDATA), dihydrophenazine compounds, or hexaazatriphenylene compounds, or combinations thereof.

11. The tandem OLED of claim 9 wherein the p-type dopant includes oxidizing agents capable of forming a charge transfer complex with the host material.

12. The tandem OLED of claim 9 wherein the p-type dopant includes iodine, $FeCl_3$, $FeF_3$, $SbCl_5$, $MoO_3$, $WO_3$, 2,3,5,6-tetrafluoro-7,7,8,8-tetracyanoquinodimethane ($F_4$-TCNQ), other derivatives of 7,7,8,8-tetra-cyanoquinodimethane (TCNQ), or hexaazatriphenylene compounds, or combinations thereof.

13. The tandem OLED of claim 1 wherein the organic light-emitting layer in each of the electroluminescent units individually emits red, green, blue, or white color, or combinations thereof.

14. The tandem OLED of claim 1 wherein the electron-injecting layer in each of the electroluminescent units is an n-type doped layer containing at least one electron-transporting material and at least one n-type dopant.

15. The tandem OLED of claim 14 wherein the electron-transporting material includes tris(8-hydroxyquinoline)aluminum (Alq), 4,7-diphenyl-1,10-phenanthroline (Bphen), 2,9-dimethyl-4,7-diphenyl-1,10 -phenanthroline (BCP), other phenanthroline derivatives, or 2,2'-[1,1'-biphenyl]-4,4'-diylbis[4,6-(p-tolyl)-1,3,5-triazine] (TRAZ), or combinations thereof.

16. The tandem OLED of claim 14 wherein the n-type dopant includes Li, Na, K, Rb, Cs, Mg, Ca, Sr, Ba, La, Ce, Nd, Sm, Eu, Tb, Dy, or Yb, or combinations thereof.

17. The tandem OLED of claim 1 wherein each layer in each of the intermediate connectors includes organic material, metal compound, or high work function metal, or combinations thereof.

18. The tandem OLED of claim 1 wherein each layer in each of the intermediate connectors is a doped layer or a non-doped layer.

19. The tandem OLED of claim 1 wherein each of the intermediate connectors includes a layer of $MoO_3$, $NiMoO_4$, $CuMoO_4$, $WO_3$, ZnTe, $Al_4C_3$, $AlF_3$, $B_2S_3$, CuS, GaP, InP, or SnTe, or combination thereof.

20. The tandem OLED of claim 1 wherein each of the intermediate connectors includes the layer of Ti, Zr, Ti, Nb, Ta, Cr, Mo, W, Re, Fe, Ru, Os, Co, Rh, Ir, Ni, Pd, Pt, Cu, Ag, Au, Zn, Al, In, or Sn, or combinations thereof.

* * * * *